(12) United States Patent
Nölscher

(10) Patent No.: US 7,297,468 B2
(45) Date of Patent: Nov. 20, 2007

(54) METHOD FOR FORMING A STRUCTURE ELEMENT ON A WAFER BY MEANS OF A MASK AND A TRIMMING MASK ASSIGNED HERETO

(75) Inventor: Christoph Nölscher, Nürnberg (DE)

(73) Assignee: Infineon Technologies AG, Neubiberg (DE)

( * ) Notice: Subject to any disclaimer, the term of this patent is extended or adjusted under 35 U.S.C. 154(b) by 693 days.

(21) Appl. No.: 10/743,105

(22) Filed: Dec. 23, 2003

(65) Prior Publication Data

US 2004/0137375 A1 Jul. 15, 2004

(30) Foreign Application Priority Data

Dec. 23, 2002 (DE) ............................. 102 60 755

(51) Int. Cl.
*G03C 5/58* (2006.01)

(52) U.S. Cl. ................ 430/313; 430/316; 430/394; 430/311

(58) Field of Classification Search ............... None
See application file for complete search history.

(56) References Cited

U.S. PATENT DOCUMENTS 6,171,730 B1 1/2001 Kuroda et al.
6,466,373 B1 10/2002 Pforr et al.
6,573,027 B1 6/2003 Imai

FOREIGN PATENT DOCUMENTS

JP 2001-144178 A 5/2001

OTHER PUBLICATIONS

Nölscher, Christoph; "Phasenmaskenkonzepte und-technologien", VDI-Berichte Nr. 935 (1991), pp. 61-80.

*Primary Examiner*—Mark F. Huff
*Assistant Examiner*—Daborah Chacko-Davis
(74) *Attorney, Agent, or Firm*—Edell, Shapiro & Finnan

(57) ABSTRACT

A method for forming a structure element in a layer arranged on a wafer by a trimming mask set, a developing step, and an etching step for the transfer of the structure pattern are carried out between the exposure steps carried out by the masks. Consequently, edges that are incipiently exposed below a limit value for the structure formation around the resist structures in a first resist layer, which are exposed using a first mask of the set, are transferred dimensionally accurately into an underlying layer on the wafer. Then, the exposure postprocesses the pattern of the first mask using a second mask of the set, the trimming mask, into a second, subsequently applied second resist layer.

15 Claims, 9 Drawing Sheets

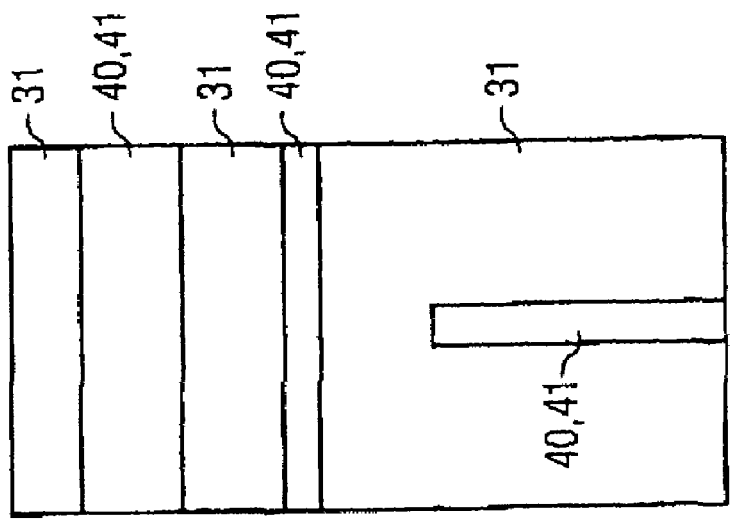
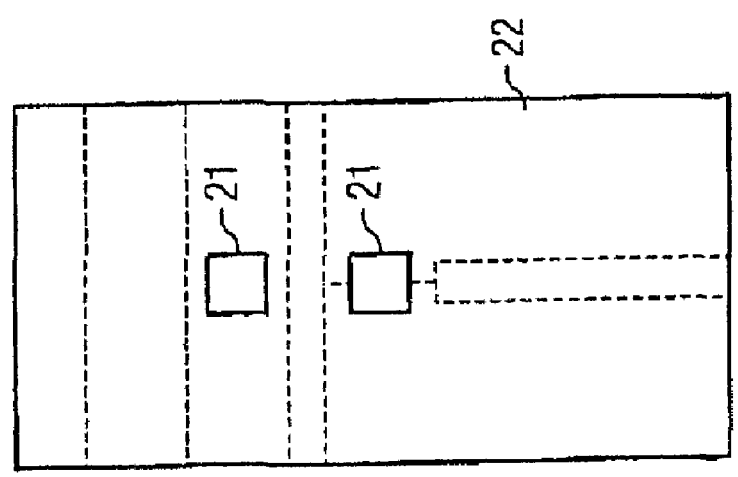
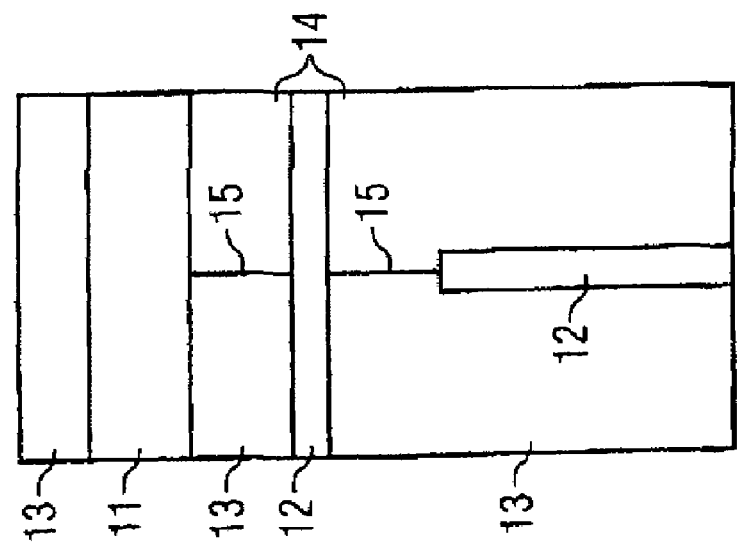

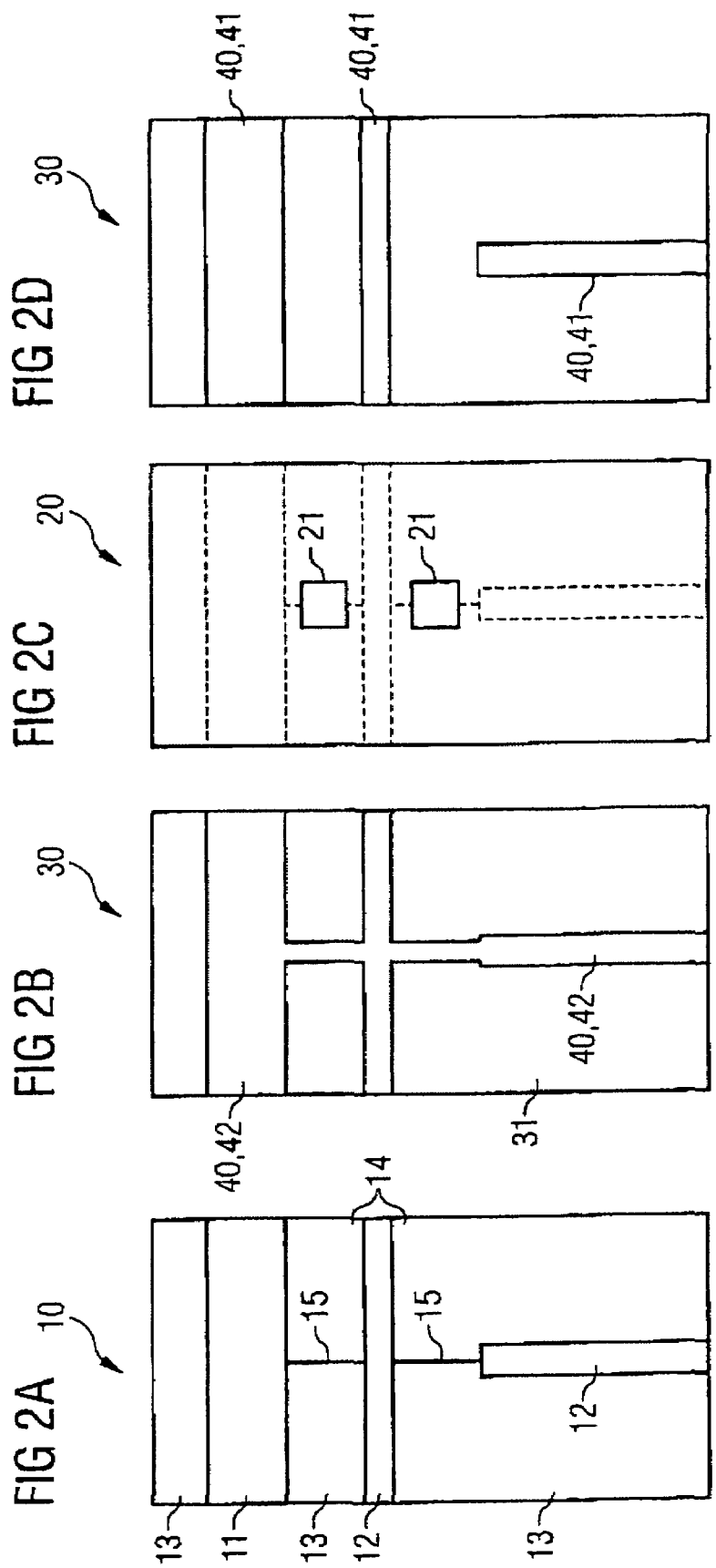

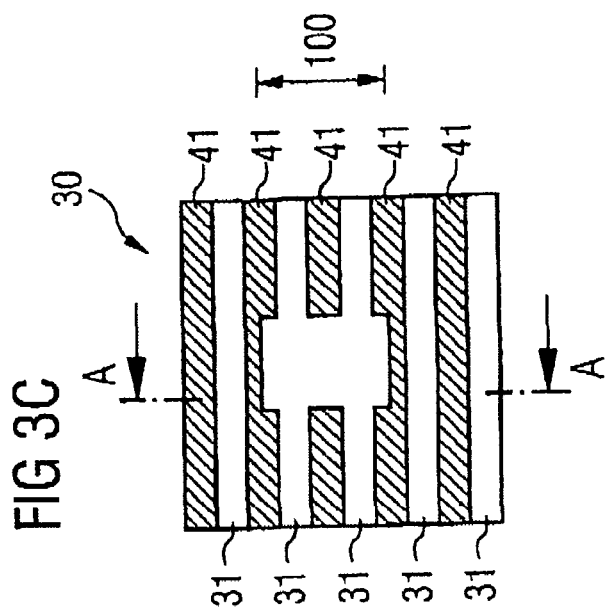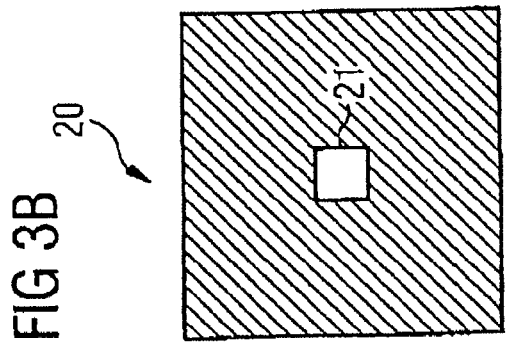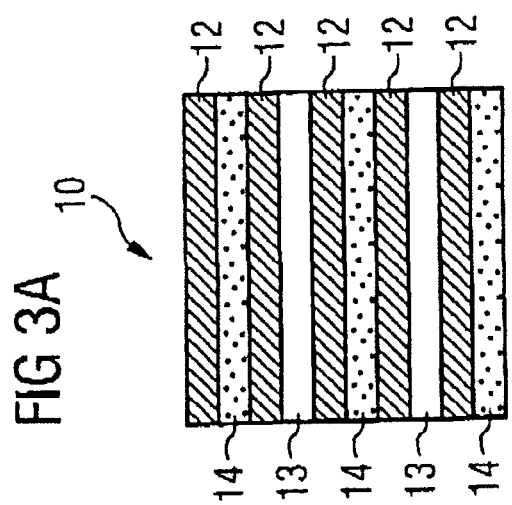

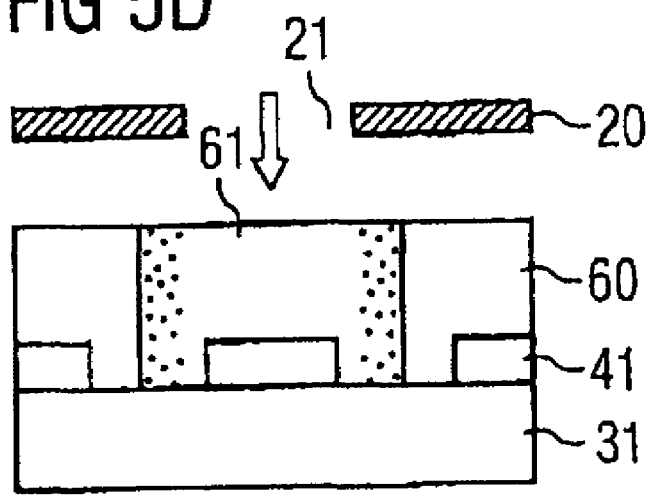
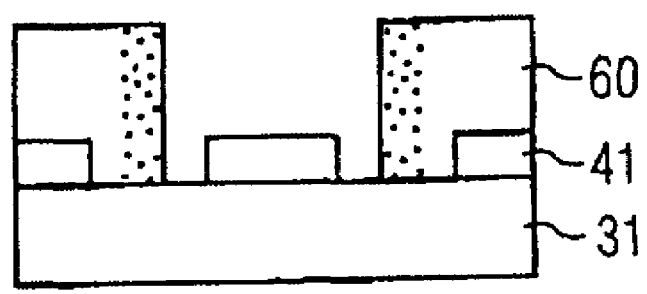
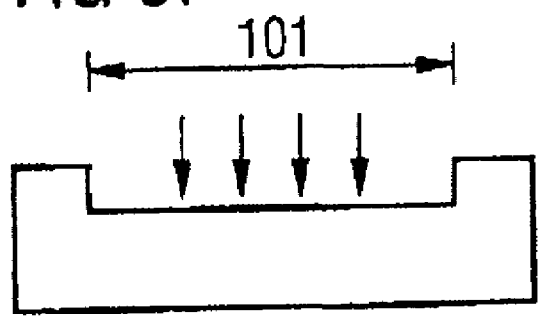

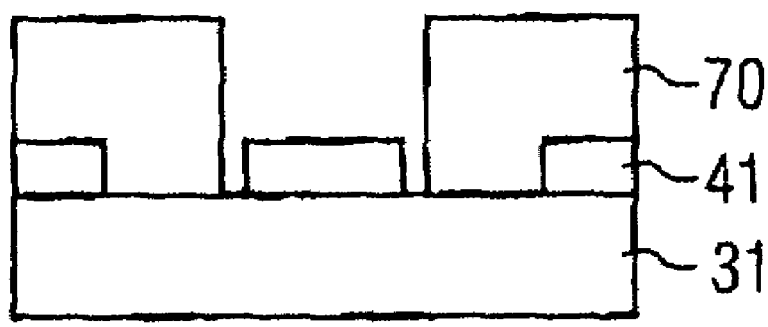
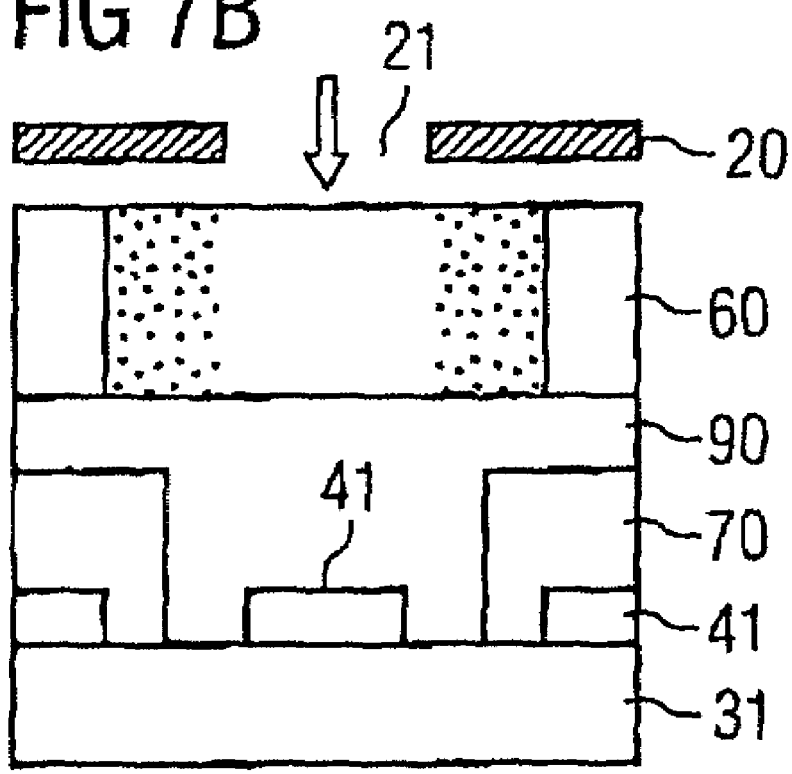

METHOD FOR FORMING A STRUCTURE ELEMENT ON A WAFER BY MEANS OF A MASK AND A TRIMMING MASK ASSIGNED HERETO

CROSS-REFERENCE TO RELATED APPLICATION

This application claims priority under 35 USC §119 to German Application No. 10260755.9, filed on Dec. 23, 2002, and titled "Method For Forming A Structure Element On A Wafer By Means Of A Mask And A Trimming Mask Assigned Hereto," the entire contents of which are hereby incorporated by reference.

FIELD OF THE INVENTION

The present invention relates to a method for forming a structure element in a layer arranged on a wafer by a first mask and a second trimming mask assigned to the first mask.

BACKGROUND

In semiconductor fabrication, in order to achieve small feature sizes, for example, on semiconductor wafers for only one layer plane, it is possible to use a plurality of masks during successive exposures. In this case, the structure pattern to be formed on the wafer including a multiplicity of structure elements is usually projected into a photosensitive layer on the semiconductor wafer by a first mask.

A particularly high resolution is achieved if masks with improved lithography techniques (litho-enhancement techniques) are used. These may be, in particular, various types of phase masks, such as, for instance, alternating phase masks, halftone phase masks, tritone phase masks, chromeless phase masks, etc. However, the aforementioned techniques may also be ones which improve the imaging properties during the projection of mask structures, for instance, OPC (Optical Proximity Correction). The use of conventional COG (Chrome on Glass) masks is also provided, of course.

A second mask, also called trimming mask, is used in order to postprocess, i.e., to "trim", the structures exposed in the photosensitive resist on the wafer through the first mask. In this case, the projection or exposure is effected partly into those regions in the photosensitive resist which have already been exposed through the first mask, but partly also into resist regions shaded by the first mask.

One advantage arises from the fact that it is possible to eliminate the side effects in the resist, which arise during the projection through phase masks. For example, the second trimming mask can be used to postexpose the shaded portions in the resist which arise at phase jumps of chromeless phase masks, insofar as the shaded portions are undesirable at specific positions on the wafer. This is because chromeless phase masks have the disadvantage that the regions provided with a phase swing on the mask have an edge region with a phase jump which represents a closed line. As a consequence, it is not possible to form arbitrary structures, in particular, lines ending in isolated fashion, arbitrarily in the resist. Through a postexposure, these closed lines on the wafer can be separated again through suitably positioned structure patterns on the trimming mask.

Alternating phase masks can be used to form particularly densely packed parallel lines in a layer on a wafer. In this case, on the mask, transparent regions with a first and a second phase swing are formed alternately in the interspaces between light-shading lines. The values for the respective phase swing typically differ by 180°, but are not restricted to this exact value. Where the light-shading lines end on the mask, the problem arises that the two transparent regions having different phase swings meet one another, so that the phase jump brought about in this region leads to an undesirable shading of the resist on the wafer during an exposure. Trimming masks are used for eliminating the problem.

The second masks of such a set, which are used as trimming masks, make it possible to use a particularly high-resolution mask type as first mask without themselves being subjected to these requirements. In particular, in a manner that saves costs, trimming masks used may be conventional masks which, under certain circumstances, are even exposed using mask writers of an older type. In the abovementioned cases, their task is rather to postexpose structures that are undesirable over a large area in a resist, the requirements made of the resolution being relatively low.

One disadvantage arises, on the other hand, from the fact that during a desired trimming, for example, of long lines formed by alternating phase masks on a wafer, the regions in the resist which are exposed through the first mask have an edge at which the radiation dose does not fall abruptly. This means that resist elements also outside the regions that are actually to be exposed have received an albeit low radiation dose. During a postexposure, through the trimming mask, the received radiation dose thereof is increased at a given position in the resist. Therefore, the exposed regions expand undesirably in the resist during a trimming mask exposure. Given extremely dense packing of closely situated lines on the first mask, it is then no longer possible to separate precisely one line from a multiplicity of closely adjacent lines. Rather, only double lines can be jointly separated.

SUMMARY

An object of the present invention is to increase the packing density of structures, in particular, lines, that can be achieved by the present photolithography. Alternatively, inexpensive exposure devices with low resolution for a given packing density of lines and/or structures can be used. Also, it is desirable to increase the quality of a trimming mask exposure process.

A method for forming a structure element in a layer arranged on a wafer by a first mask and a second trimming mask assigned to the first mask includes providing the wafer with the layer, the first mask and the second trimming mask; applying a first photosensitive resist layer to the layer, projection of a first mask structure pattern arranged on the first mask into the first resist layer for the purpose of forming an exposed resist structure, which at least partly surrounds an unexposed resist element; developing the first resist layer; etching the underlying layer with a transfer of the exposed resist structure into the underlying layer, thereby forming an elevated structure element; removing the first resist layer; applying a second photosensitive resist layer to the layer, projecting a second mask structure pattern arranged on the second trimming mask into the second resist layer for the purpose of forming a further exposed resist structure in the second resist layer, which at least partly covers the elevated structure element in the underlying layer, developing the second resist layer; and etching the underlying layer with a transfer of the further exposed resist structure into the underlying layer and the elevated structure element.

In a trimming mask exposure, the undesirable expansion of the region exposed through the second trimming mask can be avoided by the resist structure exposed by the first trimming mask being developed, etched and transferred into the underlying layer. The first resist can be removed and can be replaced by a new resist. The projection of the structure pattern of the second trimming mask can be carried out in the new resist. On account of the recently applied second resist, the resist structures exposed by the trimming mask have no preexposure on account of the first mask. Therefore, the structure pattern of the trimming mask can be transferred dimensionally accurately into the resist, and after the associated developing and etching into the layer, which has already been patterned through the first mask structure.

Only where parts of the layer have been left through the nontransparent regions of the first mask is the corresponding layer material removed through the postexposure with the subsequent transfer into the layer.

Thus, in contrast to conventional trimming mask exposure, the resist structure exposed through the first mask is not postprocessed, that is to say postexposed, rather the structure element can be brought about indirectly through the exposure with the first mask is postprocessed in the layer.

The method is similar to two successive lithographic steps using a conventional mask set for forming a layer construction including a plurality of planes stacked one above the other. A difference, however, is that one layer plane is patterned during the trimming mask process and the mask structure arrangements in each case can be coordinated with one another. The structure element postexposed by the trimming mask can include at least part of the base area of the structure element patterned by the first mask on the wafer. In this way, lines can be separated by the second trimming mask.

Taking account of lithographic margins, the superimposed transparent structure of the first mask and of the second trimming mask represents the original of a structure plane to be obtained on a wafer, for instance, of a circuit plane.

The method can be carried out for mask types of any desired kind. These masks, in particular, are appropriate for the phase masks. The method can also be used for EUV (Extreme Ultraviolet) or X-ray masks in reflection technology or else for so-called stencil masks is not ruled out.

A chrome or halftone phase mask can be specified as first mask and the projecting can be carried out with oblique exposure.

A trimming mask process or a postprocessing of the structure elements formed through the first mask with the formation of further structure elements in further layers on the wafer can be included. This becomes possible by further intermediate layers being deposited between the removal of the first resist layer and the new application for carrying out the second projection. The structure elements that have already been formed through the first mask can be opened again through further suitable processing steps. The subsequently applied second layer may also be prepared for a subsequent patterning.

With a surface prepared in this way, it is possible to expose the subsequently applied second photosensitive resist above the structure elements formed through the first mask in the context of the trimming mask process. Temporally in parallel with this, it becomes possible to expose resist structures for forming the further structure elements in the second layer above the regions of the second layer, which has not yet been opened. By doing so, the trimming mask and the mask, which include a subsequent patterning of a further plane, are combined in one mask. Consequently, a mask exposure step and/or a mask is saved in the mask set required for the entire layer construction.

BRIEF DESCRIPTION OF THE FIGURES

The invention will now be explained in more detail using an exemplary embodiment with the aid of a drawing, in which:

FIGS. 1A-1C illustrate an exemplary prior art embodiment with a detail of a mask structure pattern of an alternating phase mask, detail from a trimming mask assigned thereto, and the structure elements formed in a conventional trimming mask exposure on a wafer, respectively;

FIGS. 2A-2D illustrate an exemplary embodiment according to the present invention with the mask pair of FIGS. 1B and 1C, with the structure elements formed on a wafer after a first development and etching process, and after a second development and etching process;

FIGS. 3A-3C illustrate an example of the problem area of separating densely packed lines which are to be formed through an alternating phase mask, through a trimming mask, and on a wafer, respectively;

FIGS. 5A-5F illustrate an exemplary process sequence of a trimming mask exposure according to the invention for separating the interconnect shown in FIGS. 3A-3C;

FIGS. 7A and 7B illustrate a modification of the further process sequence of a trimming mask exposure according to the invention as shown in FIGS. 6A-6H.

DETAILED DESCRIPTION

Figure 4A:
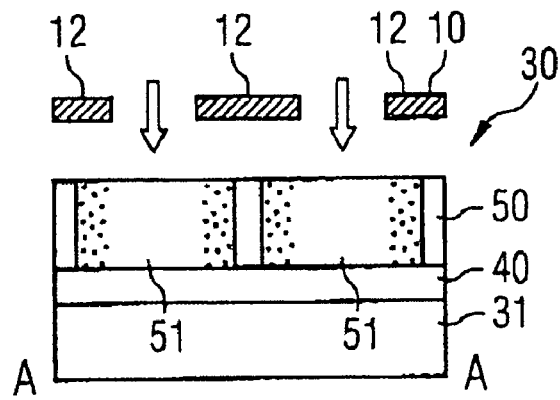
FIGS. 4A-4D illustrate a sequence of process steps of a trimming mask exposure according to the prior art.

FIGS. 1A-1C illustrate a pair of masks having a first and a second trimming mask and the result obtained using the two masks when carrying out a conventional trimming mask exposure. FIG. 1A shows a detail from a structure pattern formed on a first, alternating phase mask 10. Noncritical, nontransparent chromium webs 11 and critical chromium webs 12 can be seen in the detail. "Critical" means that the width of the webs or lines is slightly greater than the resolution limit that can be achieved with a projection system to be used on a semiconductor wafer.

As is illustrated in FIG. 3A, through alternating phase masks, high resolutions can be achieved for structure elements to be formed from chromium webs 12, if the transparent regions surrounding them are provided with an alternating phase swing, which have a mutual phase difference of approximately 180°. The lower part of FIG. 1A reveals that if these chromium webs 12 have an isolated end, such transparent first regions 13 having a first phase swing can adjoin second transparent regions 14 that can include a second phase swing. A phase jump amounting to the phase difference of 180°, for example, can be present at this boundary.

FIG. 1B shows a second trimming mask 20 with a structure arrangement at a position on the mask 20, which corresponds to that of the position of the alternating phase mask 10 shown in FIG. 1A. Trimming mask openings 21 can be formed in a chrome layer 22 surrounding them, and their positions can correspond to positions of the phase jumps 15 of the alternating phase mask 10.

A trimming mask exposure can be carried out by a layer 40, in which structure elements 41 can be formed, deposited onto a wafer 30 and resist-coated with a first photosensitive layer. Afterward, in the conventional trimming mask exposure, the structure pattern present on the alternating phase mask 10 can be projected into the photosensitive layer, directly followed by a second projection of the structure arrangement formed on the trimming mask 20. The structure elements 40 formed on the wafer 30 can be seen in FIG. 1C.

FIGS. 2A-2D show, for the trimming mask pair illustrated in FIGS. 1A and 1B (FIGS. 2A and 2C), structure elements 41 formed on a wafer 30, if the method according to the invention of a trimming mask exposure is carried out. For this purpose, after the projection of the structure arrangement from the alternating phase mask 10, a development, etching and resist removal step can be carried out, thereby achieving the patterning of the applied layer 40 on a wafer surface 31, as shown in FIG. 2B. In this case, the structure elements 42 formed in the layer 40 can include regions in the first photosensitive layer that were shaded by the phase jumps 15.

The patterning shown in FIG. 2D results after the application of a second photosensitive resist, the projection of the structure pattern arranged on the trimming mask 20 into the resist, a further development, etching and resist removal step.

While the difference between the trimming mask exposure process according to the invention and the conventional process as illustrated in FIGS. 1A-1C and FIGS. 2A-2D is of an illustrative nature, the advantage of the present invention becomes particularly clear from the problem illustrated by way of example in FIGS. 3A-3C. If use is made of the trimming mask 20 illustrated in FIG. 3B, which includes a trimming mask opening 21 in opaque surroundings in order to separate one of the lines 12 on the alternating phase mask 10, which is illustrated in FIG. 3A, then the result can be the line structure on a wafer 30 as illustrated in FIG. 3C.

It can be seem that even with a dimensioning of the trimming mask opening of the order of magnitude of the width of the lines 12, an expansion of the exposed region on the wafer 30 can result, so that a plurality of lines can be separated or impaired. In the present exemplary embodiment, a COG mask is used as second trimming mask 20.

The problem in the conventional trimming mask exposure is illustrated by the cross-sectional profile as shown in FIG. 4A, a view taken along a line A-A in FIG. 3C. Metal interconnects 41 can be formed as structure elements made of tungsten silicide, for example, in elevated fashion above an oxide layer 31 on the wafer 30. This can involve interconnects 41 having a critical width, as are present, for instance, in word or bit lines in a memory cell array.

The structure pattern of an alternating phase mask 10 can be projected in a resist 50 applied on the metal layer 40 to form exposed resist structures. The opaque mask structures 12 can correspond to the positions of the interconnects 41 without taking account of the separation to be carried out. The separation is, for example, carried out by a trimming mask 20 at a central interconnect, illustrated in cross-section in FIG. 4A.

The exposed resist structures 51 in the resist 50 adjoin regions, shown in dotted fashion, in the resist 50 whose received radiation dose does not suffice to have a structure-forming effect after a development. However, the regions illustrated in dotted fashion can be incipiently exposed (FIG. 4A), so that, in an exposure process carried out subsequently, received radiation may exceed a threshold value, as a result of which, the structure-forming property may occur in the regions illustrated in dotted fashion.

Figure 4B:
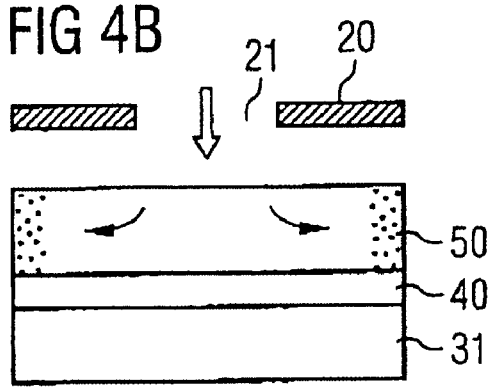

This effect can occur through the exposure with the trimming mask 20, as illustrated in FIG. 4B. Although attenuated light contributions can be made within the resist structures shaded by the mask 20, an expansion of the exposed resist structures can occur.

Figure 4C:
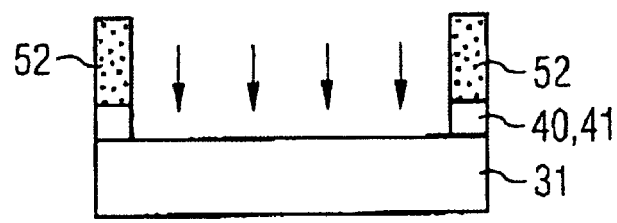
Figure 4D:
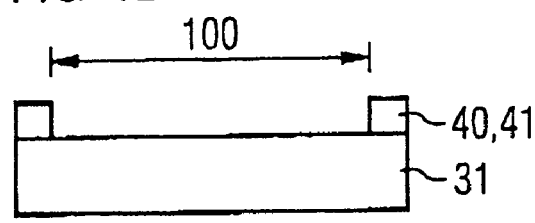

The development and etching that are subsequently carried out (FIG. 4C) can give rise to unexposed resist elements 52 of reduced width. The transfer of the latter into structure elements 41 in the metal layer 40 can lead to thin or even destroyed metal interconnects above the oxide layer 31. Therefore, the width 100 of the region separated through the trimming mask 20 can be too large to enable individual lines to be separated.

Figure 5A:
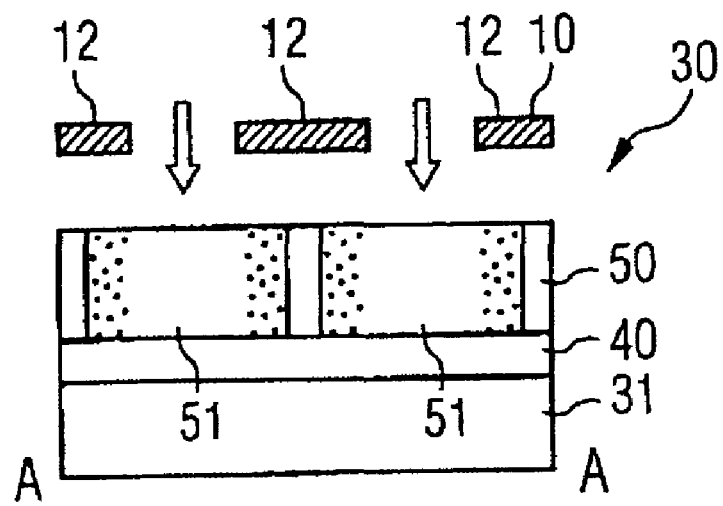
Figure 5B:
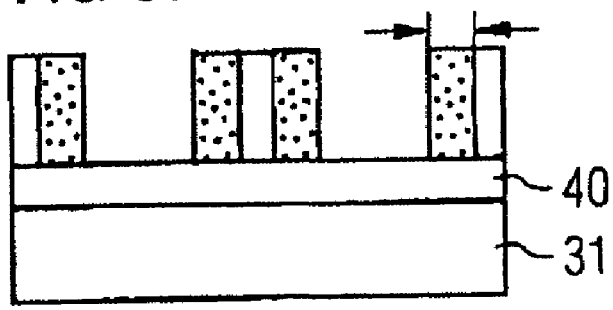
Figure 5C:
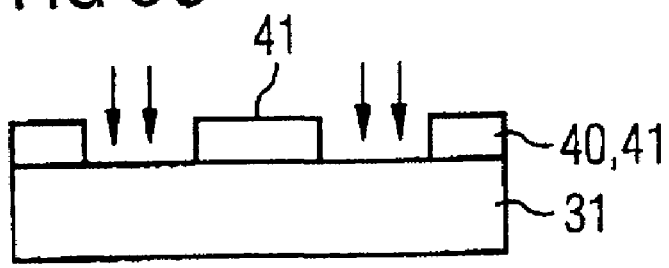

FIGS. 5A-5F show an exemplary embodiment which solves the problem shown in FIGS. 3A-3C. The exposure of the first photosensitive resist 50 using the alternating phase mask 10, as shown in FIG. 5A, corresponds to that of the traditional trimming mask process. An expansion of the exposed resist structures into the incipiently exposed regions, illustrated in dotted fashion, can be prevented by a development step (FIG. 5B) that can be carried out before a through-exposure beyond their threshold value, so that, in a subsequent etching step (FIG. 5C), the line widths of the interconnects 12 can be transferred into the layer 40 and preserved.

For the trimming mask exposure (FIG. 5D), after the removal of the old resist residues of the first photosensitive resist 50, a new, second photosensitive resist 60 can be applied and exposed. The development step (FIG. 5E) and etching step (FIG. 5F) do not lead to an expansion of the exposed resist structures or a constriction of the previously unexposed resist elements.

In this case, the term unexposed resist elements also denotes the resist regions which are only incipiently exposed, i.e., provided with a radiation dose below the threshold value for structure formation.

The width 101 of the separation of the lines that is brought about through the trimming mask 20 can be reduced. A separation of individual interconnects becomes possible.

Figure 6A:
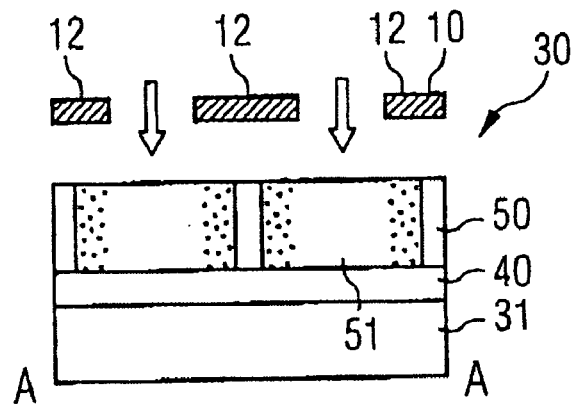
FIGS. 6A-6H illustrate a further exemplary process sequence of the trimming mask exposure according to the invention.
Figure 6B:
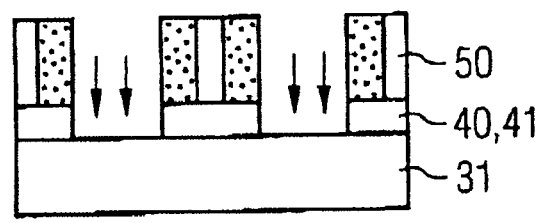
Figure 6C:
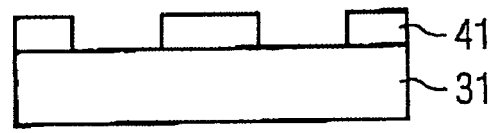
Figure 6D:
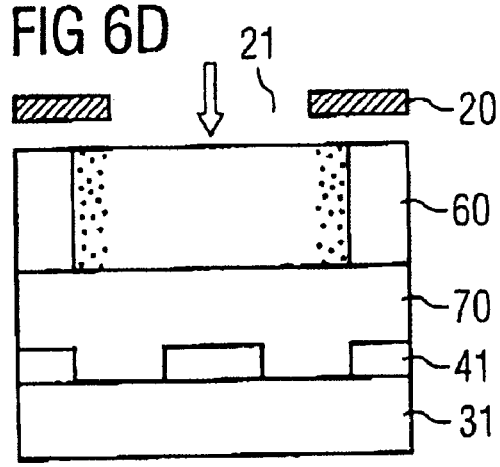

FIGS. 6A-6H illustrate a method including projection of the structures arranged on the first mask 10 (FIG. 6A), the first development (FIG. 6B), the etching and the resist removal (FIG. 6C) correspond to the previous exemplary embodiment. However, an intermediate insulator layer 70 can be deposited on the structure elements or metal interconnects 41 can be formed. An additional photosensitive resist 68 can be applied and exposed with structures of a mask 120, the mask serving for forming contact holes between two metallization planes. The lower metallization plane can correspond to the interconnects 41 just patterned (FIG. 6D).

The openings 21 in the trimming mask 20, also used as contact hole mask, may be larger than those openings of the contact hole plane. Consequently, a trimming mask can be produced using an inexpensive device, for instance, of an earlier technology generation.

Figure 6E:
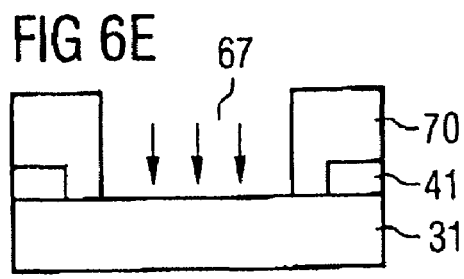
Figure 6F:
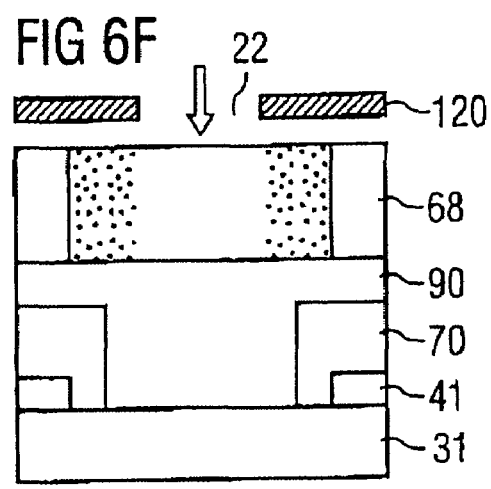
Figure 6G:
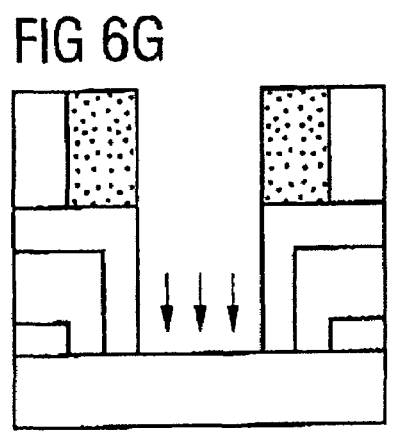
Figure 6H:
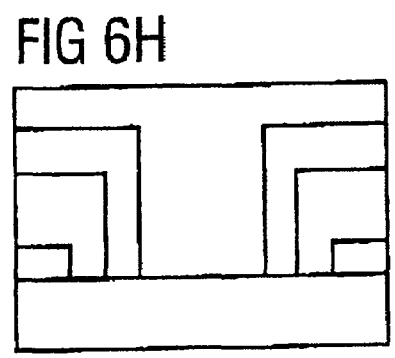

The insulator etching and the etching for separating the interconnects 41 (metal etching) may be carried out by inexpensive wet etching steps. Possibly uncovered metal of adjacent interconnects can be postoxidized, for example, using hydrogen peroxide. Referring to FIG. 6F, a metal layer 90 can be deposited and patterned with a further mask 120 for forming an upper metallization plane with further interconnects. For this purpose, a further mask 120 with openings 22 can be used to expose corresponding regions in a further photosensitive resist 68, as illustrated in FIGS. 6F-6H.

The trimming mask with its trimming mask openings 21 can be combined with the mask for forming the contact holes with contact hole openings.

Referring to FIGS. 7A and 7B, a method can include at least one further process step for forming other layers that can be carried out between the projection with the first mask 10 and that of the trimming mask 20. In this example, an intermediate insulator layer can be inserted and patterned in a similar manner to that shown in FIG. 6D.

In contrast to FIG. 6E, however, in accordance with FIG. 7A, only the intermediate insulator layer below the opening 21 is removed. Thus, in accordance with this variant, the mask 20 of FIG. 6D is not the trimming mask in a narrow sense, since the metal interconnect 41 is not separated with it. Rather, as is shown in FIG. 7B, a metallization is carried out, for example, with aluminum. In the subsequent lithography for patterning the metal plane, the trimming mask 20 can be combined with the mask for forming the metallization plane. Situated on this mask can be the trimming mask openings 21 together with the structures for the formation of the interconnects of this upper metallization plane. The exposure of the applied second photosensitive resist 60 with the subsequent development and etching can lead to the removal of the metallization above the interconnects 41 and to the removal of the interconnects 41 below the openings 21, so that the interconnects 41 can be separated together with the patterning of the upper metallization plane. This can save both the production of a mask and a separate lithography, development and etching step with subsequent resist removal.

It is possible to carry out the lithography step relating to the first mask 10 for patterning a gate plane instead of the metallization plane, a layer including silicon nitride ($Si_3N_4$) can be an intermediate insulator layer.

With the present invention, the design and structure arrangements on wafers can be planned with even greater density than has been possible hitherto in the case of conventional techniques.

Trimming openings without metallization or with an etched-through underlying conductive layer whose edge is electrically insulated from a metallization of the contact holes/vias may be present as resulting structures in accordance with the abovementioned variants.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

10 First mask
15 Phase jump on chromeless or alt. phase mask
20 Second mask, trimming mask
30 Wafer
40 Layer, arranged on wafer,
41 Structure element, interconnects
50 First resist layer
51 Exposed resist structure
60 Second resist layer
61 Exposed resist structure
70 Intermediate layer

I claim:

1. A method for forming a structure element in a layer arranged on a wafer by a first mask and a second trimming mask assigned to the first mask, comprising:

providing the wafer with the layer, the first mask, and the second trimming mask;
applying a first photosensitive resist layer to the layer;
projecting a first mask structure pattern arranged on the first mask into the first resist layer to form an exposed resist structure, the exposed resist structure at least partly surrounding an unexposed resist element;
developing the first resist layer;
etching the layer with a transfer of the exposed resist structure into the layer, thereby forming an elevated structure element in the layer below the unexposed resist element;
removing the first resist layer;
depositing and patterning lithographically an intermediate layer;
applying a second photosensitive resist layer to the layer;
projecting a second mask structure pattern arranged on the second trimming mask into the second resist layer to form a second exposed resist structure in the second resist layer, the second exposed resist structure at least partly covering the elevated structure element in the layer;
developing the second resist layer; and
etching the layer with a transfer of the second exposed resist structure into the layer and the elevated structure element.

2. The method as claimed in claim 1, wherein projecting the first mask structure pattern arranged on the first mask is carried out using an alternating or a chromeless phase mask.

3. The method as claimed in claim 2, wherein projecting the first mask structure pattern arranged on the first mask forms a plurality of elevated metal interconnects, the metal interconnects being arranged substantially parallel.

4. The method as claimed in claim 3, wherein, in etching of the layer with a transfer of the second exposed resist structure into the layer, at least one of the elevated metal interconnects is separated into at least two structure elements.

5. The method as claimed in claim 1, wherein projecting the first mask structure pattern arranged on the first mask is carried out using a chrome or halftone phase mask with oblique exposure.

6. The method as claimed in claim 5, wherein projecting the first mask structure pattern arranged on the first mask forms a plurality of elevated metal interconnects, the metal interconnects being arranged substantially parallel.

7. The method as claimed in claim 6, wherein, in etching of the layer with a transfer of the second exposed resist structure into the layer, at least one of the elevated metal interconnects is separated into at least two structure elements.

8. The method as claimed in claim 1, wherein the elevated structure element is formed in the layer, the elevated structure element including an electrically conductive material.

9. The method as claimed in claim 1, wherein projecting the first mask structure pattern arranged on the first mask forms a plurality of elevated metal interconnects, the metal interconnects being arranged substantially parallel.

10. The method as claimed in claim 9, wherein, in etching of the layer with a transfer of the second exposed resist structure into the layer, at least one of the elevated metal interconnects is separated into at least two structure elements.

11. The method as claimed in claim 1, wherein projecting the first mask structure pattern arranged on the first mask forms the elevated structure element in a partial region by a phase jump and sets up on the first mask between two adjoining transparent regions on the first mask, and etching of the layer with a transfer of the second exposed resist structure into the layer removes the partial region.

12. The method as claimed in claim 1, wherein an electrically insulating material is used as material of the intermediate layer.

13. The method as claimed in claim 1, wherein, in the lithographic patterning of the intermediate layer, the elevated structure element is uncovered below the intermediate layer by removal of a part of the intermediate layer.

14. The method as claimed in claim 13, wherein, in projecting the second mask structure pattern arranged on the second trimming mask into the second resist layer, a third exposed resist structure is exposed in the second resist layer, the third exposed resist structure covering a region above the intermediate layer which has not been previously removed during the lithographic patterning.

15. The method as claimed in claim 14, wherein the third exposed resist structure for forming a contact hole, is transferred into the intermediate layer, the contact hole being filled with an electrically conductive material in a further step.

* * * * *